(12) United States Patent
Takeguchi

(10) Patent No.: US 8,835,248 B2
(45) Date of Patent: Sep. 16, 2014

(54) METHOD FOR FORMING METAL WIRE

(75) Inventor: Naoki Takeguchi, Yokkaichi (JP)

(73) Assignee: SanDisk Technologies Inc., Plano, TX (US)

(*) Notice: Subject to any disclaimer, the term of this patent is extended or adjusted under 35 U.S.C. 154(b) by 96 days.

(21) Appl. No.: 13/480,154

(22) Filed: May 24, 2012

(65) Prior Publication Data
US 2013/0316531 A1 Nov. 28, 2013

(51) Int. Cl.
*H01L 21/8242* (2006.01)
(52) U.S. Cl.
USPC ........... 438/242; 438/270; 438/637; 438/672; 438/680; 438/678; 257/E21.006; 257/E21.007; 257/E21.37; 257/E21.395; 257/E21.499; 257/E21.546
(58) Field of Classification Search
USPC ......... 438/242, 267, 270, 672, 680, 678, 700; 257/E21.006, E21.007, E21.37, 257/E21.395, E21.499, E21.546, E21.645, 257/E21.649
See application file for complete search history.

(56) References Cited

U.S. PATENT DOCUMENTS

| 6,139,905 | A | 10/2000 | Chen et al. | |
|---|---|---|---|---|
| 6,303,430 | B1 * | 10/2001 | Jenq | 438/253 |
| 6,361,880 | B1 | 3/2002 | Clevenger et al. | |
| 6,372,633 | B1 | 4/2002 | Maydan et al. | |
| 6,716,733 | B2 | 4/2004 | Lee et al. | |
| 6,780,752 | B1 | 8/2004 | Lee | |
| 7,166,889 | B2 * | 1/2007 | Tsunoda et al. | 257/321 |
| 7,468,317 | B2 * | 12/2008 | Cho et al. | 438/622 |
| 7,521,357 | B2 * | 4/2009 | Lee et al. | 438/634 |
| 7,745,325 | B2 * | 6/2010 | Koh et al. | 438/622 |
| 8,097,500 | B2 * | 1/2012 | Ando et al. | 438/197 |
| 2006/0251801 | A1 | 11/2006 | Weidman et al. | |

* cited by examiner

*Primary Examiner* — David Nhu
(74) *Attorney, Agent, or Firm* — Vierra Magen Marcus LLP

(57) ABSTRACT

Techniques for fabricating metal lines in semiconductor systems are disclosed. The metal may be tungsten. A hybrid Chemical Vapor Deposition (CVD)/Physical Vapor Deposition (PVD) process may be used. A layer of tungsten may be formed using CVD. This CVD layer may be formed over a barrier layer, such as, but not limited to, TiN or WN. This CVD layer may completely fill some feature such as a trench or via. Then, a layer of tungsten may be formed over the CVD layer using PVD. The layers of tungsten may then be etched to form a wire or line. Techniques for forming metal wires using a hybrid CVD/PVD process may provide for low resistivity with a barrier metal, low surface roughness, and good gap filling.

21 Claims, 16 Drawing Sheets

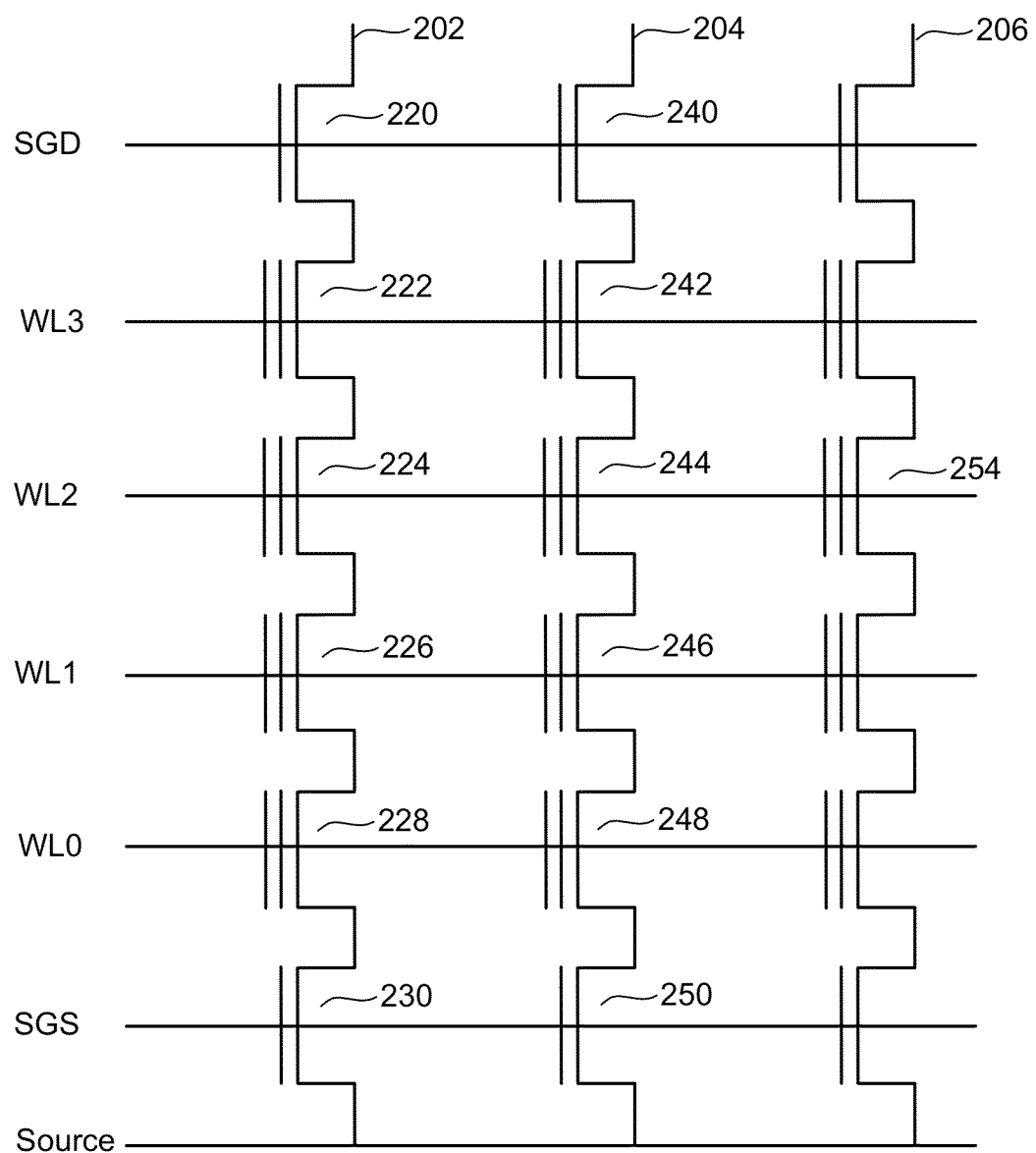

METHOD FOR FORMING METAL WIRE

BACKGROUND

This disclosure relates to methods for forming metal wires or lines in semiconductor systems.

Forming metal lines or wires in semiconductor systems presents many challenges. In some situations the metal is used to fill some feature such as, but not limited to, a trench or via. Trenches, vias, and other features can be difficult to fill, especially if they have a high aspect ratio. Sometimes the metal will not completely fill the feature such that voids are present.

Another challenge with forming metal lines or wires is to achieve a smooth surface. Some techniques for forming metal lines result in the metal having a rough surface. One option is to planarize the surface. However, planarizing can lead to uneven thicknesses.

Furthermore, it is desirable for the metal to have low resistivity. However, some techniques result in the metal having undesirably high resistivity, especially at certain interfaces.

Some techniques make a tradeoff in which one or more qualities are sacrificed in favor of others. For example, smoothness and uniform thickness may be sacrificed in favor of low resistivity. Thus, achieving all or most of the above can be difficult.

BRIEF DESCRIPTION OF THE DRAWINGS

FIG. 2A is a circuit diagram of three NAND strings with associated word lines.

DETAILED DESCRIPTION

Disclosed herein are techniques for forming metal lines or wires in a semiconductor device. In some embodiments, the metal is tungsten. In one embodiment, a hybrid Chemical Vapor Deposition (CVD)/Physical Vapor Deposition (PVD) process is used. In one embodiment, a layer of tungsten is formed using CVD. This CVD layer may be formed over a barrier layer, such as, but not limited to, titanium nitride (TiN) or tungsten nitride (WN). This CVD layer may completely fill some feature such as a trench or via. Then, a layer of tungsten is formed over the CVD layer using PVD. The layers of tungsten may then be etched to form a wire or line.

The CVD layer may provide for good gap filling in the feature. Thus, the feature may be filled with tungsten without voids. The CVD layer may also have a low resistivity on the barrier layer. Furthermore, the PVD layer may be very smooth. Note that in some embodiments the PVD layer is not planarized since it is smooth. Overall, the hybrid CVD/PVD process may provide for low resistivity, low roughness, good gap filling, and low thickness variation.

Note that using only CVD for the entire tungsten structure may have drawbacks. First, CVD deposited tungsten may have a rough surface. One possible solution to this rough surface is to planarize. However, even if this rough surface were to be planarized, then the overall thickness of the tungsten may vary. Embodiments using a hybrid CVD/PVD process provide a smooth surface without the need to planarize. Also, embodiments provide for a structure that is uniformly thick.

Note that there may be drawbacks to using only PVD deposited tungsten for the entire tungsten structure. If PVD were to be used to fill a feature such as a trench or via with tungsten, voids may result. In other words, the ability to fill gaps may not be good when using PVD. However, by using CVD to fill features with tungsten, voids are prevented or substantially reduced.

Furthermore, note that if tungsten is formed directly onto some barrier metals using PVD, then the resistivity may be high. However, embodiments that use CVD to form tungsten on a barrier metal provide for low resistivity.

Therefore, one embodiment that forms metal wires using a hybrid CVD/PVD process provides for low resistivity with a barrier metal, low surface roughness, and good gap filling.

The techniques described herein are applicable to wide range of metal structures. In some embodiments, a metal line is formed. In some embodiments, the metal line is in a memory array. For example, the metal line could be a select line or a word line. The following is one example NAND architecture. However, techniques described herein are not limited to forming metal lines in memory arrays.

Figure 1:
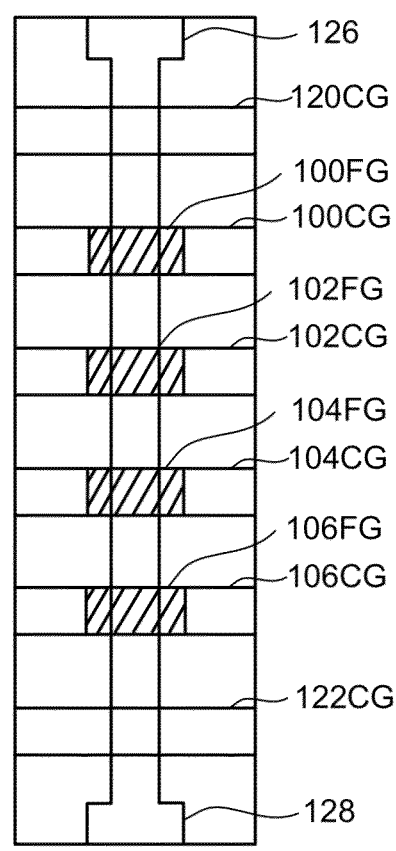
FIG. 1 is a top view of a NAND string.

One example of a flash memory system uses the NAND structure, which includes arranging multiple floating gate transistors in series between two select gates. The transistors in series and the select gates are referred to as a NAND string. FIG. 1 is a top view showing one NAND string. The NAND string depicted in FIG. 1 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

FIG. 2A shows three NAND strings 302, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. In one embodiment, at least a portion of selection line SGS is formed using a hybrid CVD/PVD process. The selection line SGS may be formed at least in part with tungsten. The various NAND strings are connected to respective bit lines by select transistors 220, 240, etc., which are controlled by select line SGD. In one embodiment, at least a portion of selection line SGD is formed using a hybrid CVD/PVD process. The selection line SGD may be formed at least in part with tungsten.

In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 254. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array. In one embodiment, at least a portion of the word lines are formed using a hybrid CVD/PVD process. For example, an upper portion of the word lines may be formed with tungsten using a hybrid CVD/PVD process.

Figure 2B:
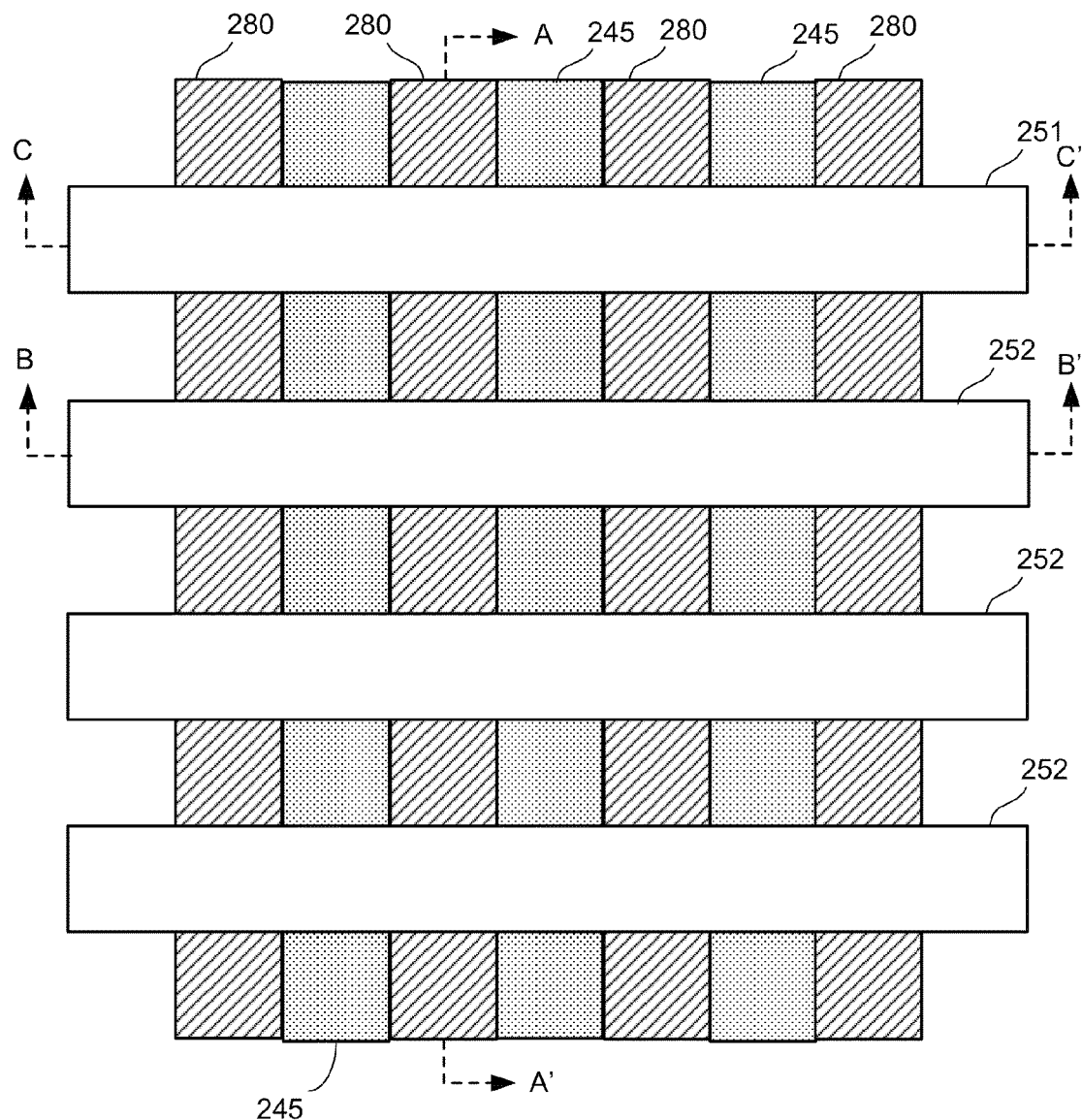
FIG. 2B is a top view of the three NAND strings and word lines.

FIG. 2B is a top view of a portion of an array of NAND flash memory cells. The array includes bit lines 280, word lines 252, and a select line 251. Shallow trench isolation (STI) structures 245 are depicted between the bit lines 280 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Figure 3:
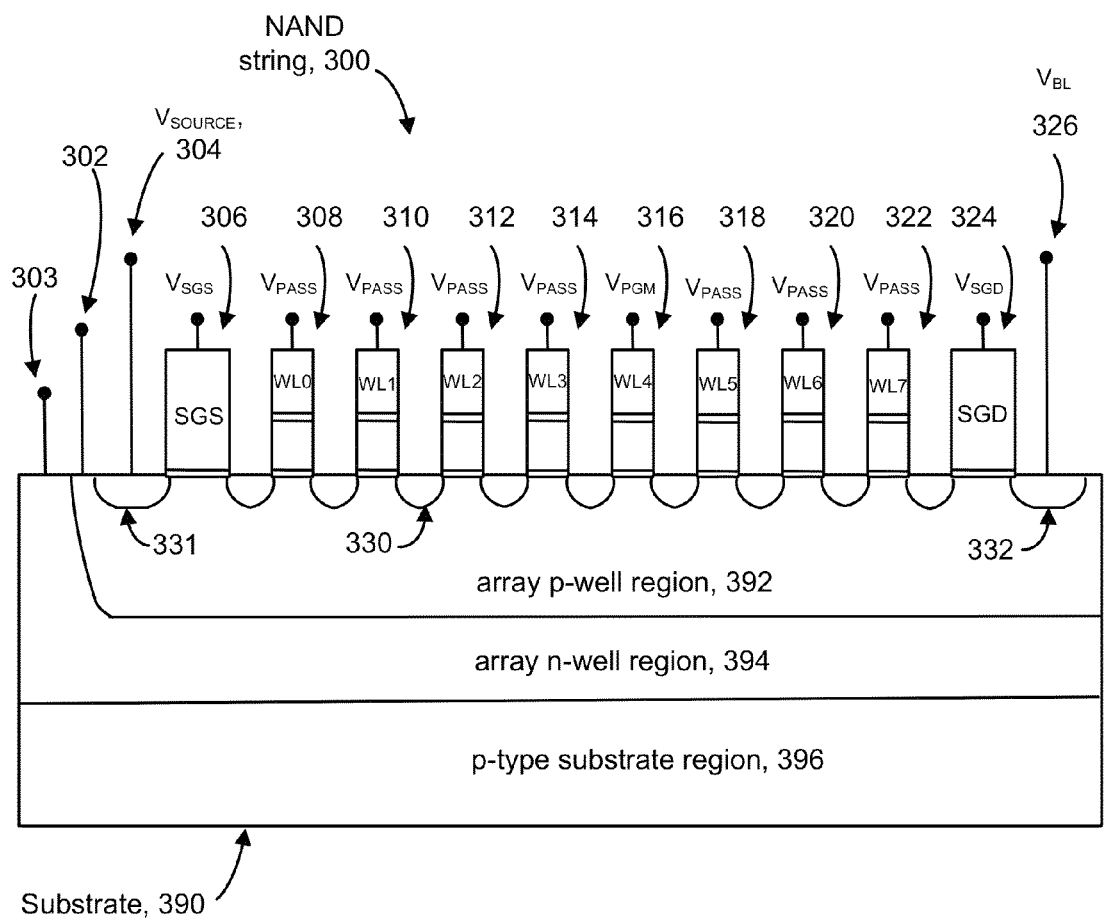
FIG. 3 depicts a cross-sectional view of a NAND string formed on a substrate.

FIG. 3 depicts a cross-sectional view of a NAND string formed on a substrate. The view is simplified and not to scale. The NAND string 300 includes a source-side select gate (or SGS transistor) 306, a drain-side select gate (or SGD transistor) 324, and eight storage elements 308, 310, 312, 314, 316, 318, 320 and 322, formed on a substrate 390. A number of source/drain regions, one example of which is source drain/region 330, are provided on either side of each storage element. In one embodiment, the substrate 390 employs a triple-well technology which includes an array p-well region 392 within an array n-well region 394, which in turn is within a p-type substrate region 396. The NAND string and its non-volatile storage elements can be formed, at least in part, on the array p-well region 392.

A voltage $V_{SOURCE}$ is provided to a source line contact 304. The source line contact has an electrical connection to the diffusion region 331 of SGS transistor 306. A bit line voltage $V_{BL}$ is supplied to bit line contact 326, which is in electrical contact with the diffusion region 332 of SGD transistor 324. Voltages, such as body bias voltages, can also be applied to the array p-well region 392 via a terminal 302 and/or to the array n-well region 394 via a terminal 303.

During a program operation, a control gate voltage $V_{PGM}$ is provided on a selected word line, in this example, WL3, which is associated with storage element 314. Further, recall that the control gate of a storage element may be provided as a portion of the word line. For example, WL0, WL1, WL2, WL3, WL4, WL5, WL6 and WL7 can extend via the control gates of storage elements 308, 310, 312, 314, 316, 318, 320 and 322, respectively. A pass voltage, $V_{PASS}$ is applied to the remaining word lines associated with NAND string 300, in one possible boosting scheme. $V_{SGS}$ and $V_{SGD}$ are applied to the select gates 306 and 324, respectively.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "0." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Non-volatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 4A:
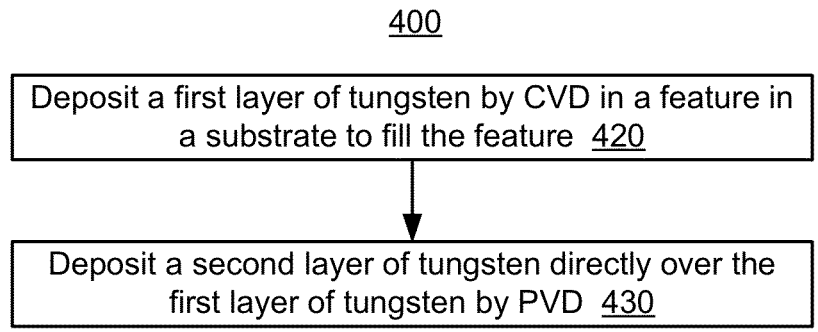
FIG. 4A is a flowchart describing one embodiment of a hybrid CVD/PVD process for forming a tungsten structure.
Figure 4B:
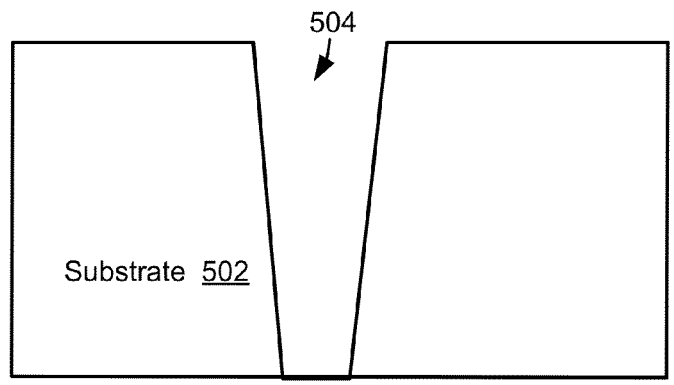
FIGS. 4B-4D show results after various stages of the process of FIG. 4A.
Figure 4C:
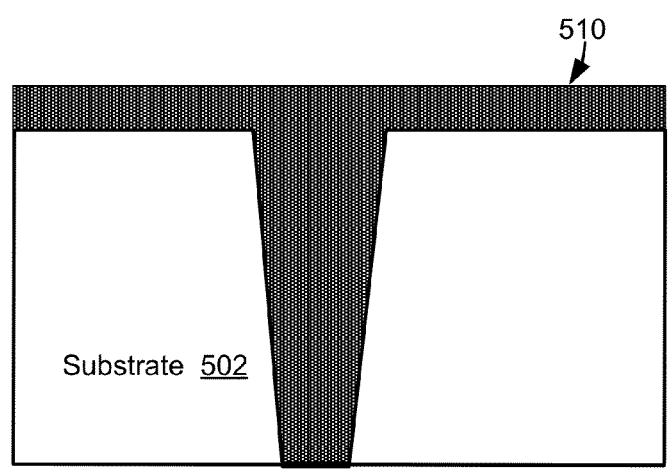
Figure 4D:
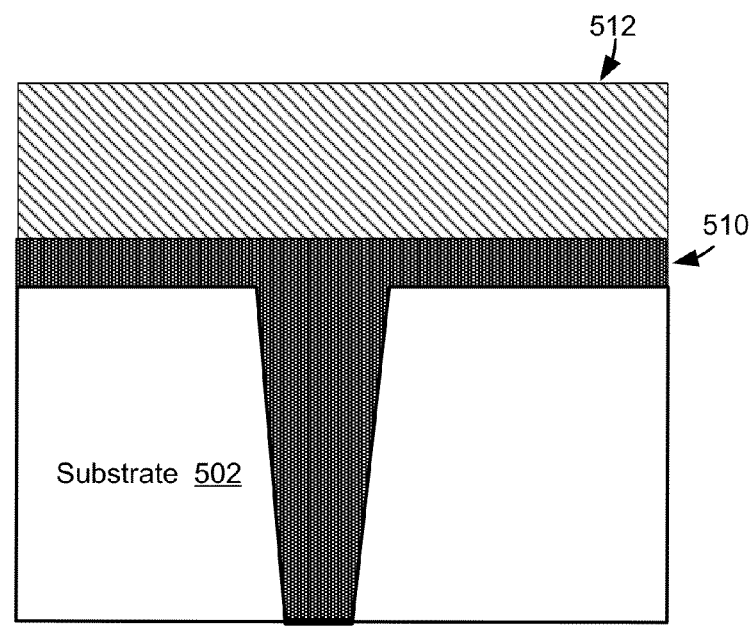

FIG. 4A is a flowchart describing one embodiment of a hybrid CVD/PVD process 400 for forming a tungsten structure. FIGS. 4B-4D show results after various stages of process 400. In step 420, a first layer of tungsten is deposited by CVD in a feature. The feature could be a trench, via, or some other structure. In one embodiment, the tungsten completely fills the feature. In one embodiment, the tungsten completely covers the feature. FIG. 4B depicts a substrate 502 have a feature 504. The feature could be a trench, via, or some other structure. The substrate 502 could be any material. For example, the substrate 502 could be polysilicon. However, the substrate 502 could be some other material such as an insulator. An example insulator is silicon dioxide. FIG. 4C depicts results after step 420 showing that the tungsten 510 has completely filled the feature. In this example, the tungsten 510 has completely covers the feature. In other words, the tungsten 510 is not merely a liner, which lines sidewalls of the feature 504. The tungsten 510 also extends over the substrate 502 outside of the feature. In one embodiment, a thin layer of barrier metal (not depicted in FIGS. 4B or 4C) is formed on the sides of the feature 504 prior to depositing the tungsten 510.

In step 430, a second layer of tungsten is deposited over the first layer of tungsten by PVD. The second layer may be deposited directly onto the first layer of tungsten. The second layer may be deposited without planarizing the first layer. FIG. 4D depicts results after step 430 showing the second layer of tungsten 512 over the first layer 510.

As one example, the feature 504 in FIGS. 4B-4D may be about 20 nm wide near the top. As one example, the thickness of the first layer of tungsten 510 above the substrate 502 may be about 5 nm. As one example, the thickness of the second layer of tungsten 512 above the substrate 502 may be about 45 nm. Thus, in this example, the second layer of tungsten 512 is substantially thicker than the first layer 510 (when measured based from the top surface of the substrate 502). However, the relative thicknesses of the first and second layers of tungsten 510, 520 could be different.

Figure 5A:
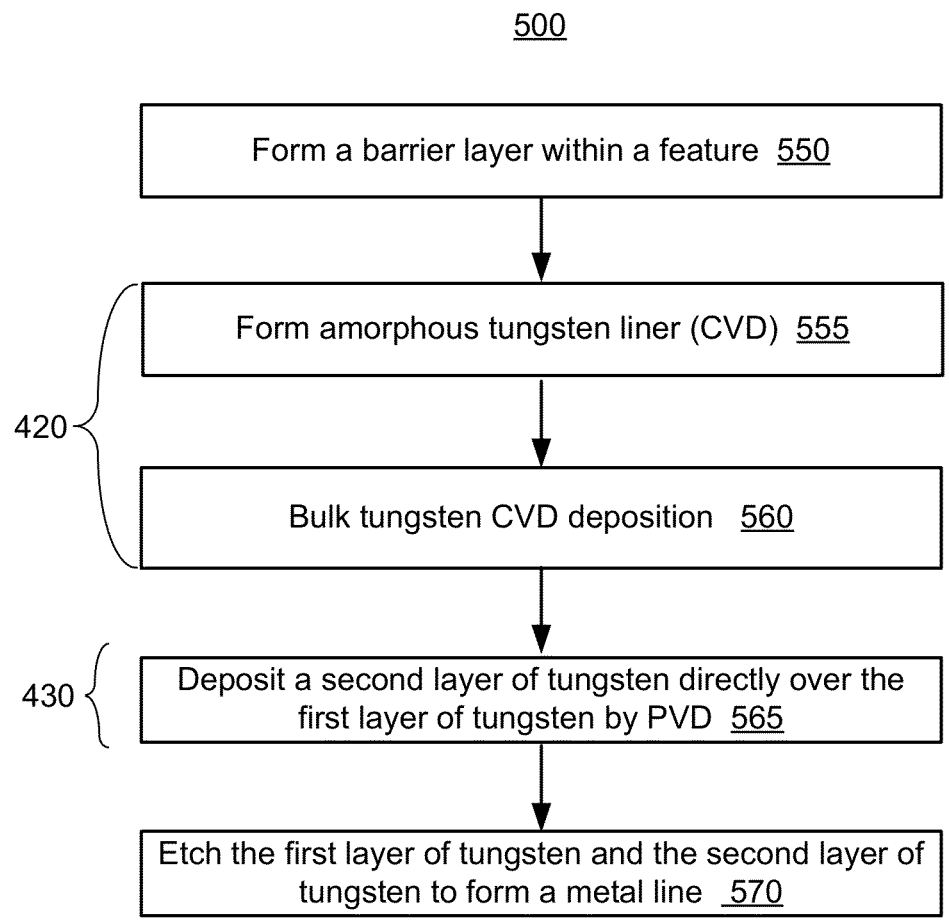
FIG. 5A is a flowchart describing one embodiment of a process of fabricating a metal line using a hybrid CVD/PVD process.
Figure 5B:
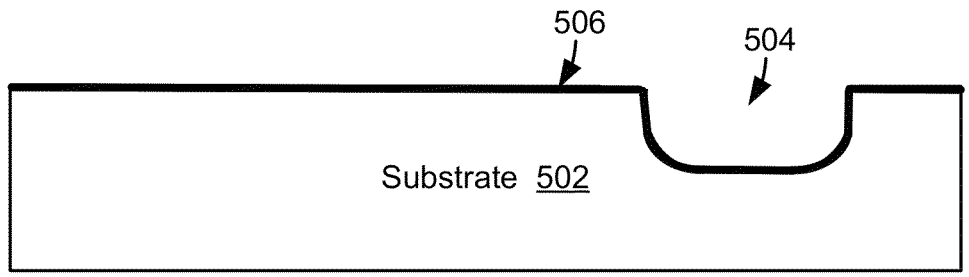
FIGS. 5B-5F are diagrams illustrating results after various steps of the process of FIG. 5A.

FIG. 5A is a flowchart describing one embodiment of a process 500 of fabricating a metal line using a hybrid CVD/PVD process. FIGS. 5B-5F are diagrams illustrating results after various steps. In step 550, a barrier layer is formed in a feature. The barrier layer may be a barrier metal. The feature could be a trench, via, or some other structure. The barrier layer may be, for example, TiN or WN. FIG. 5B shows results after step 550. FIG. 5B shows a feature 504 formed in a substrate 502. The substrate 502 may be, but is not limited to, polysilicon. A barrier layer 506 is formed on sides of the feature 504 and over the substrate 502 outside of the feature 504. The feature 504 may be about 30 nm wide, as one example. The barrier layer 506 may be about 5 nm thick, as one example.

Figure 5C:
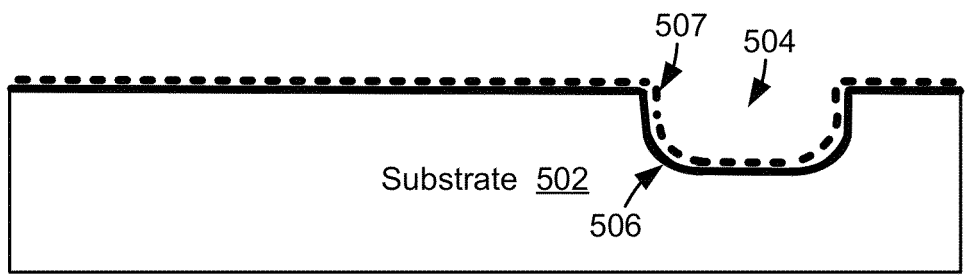

In step 555, an amorphous tungsten liner is formed over the barrier layer. In one embodiment, the amorphous tungsten liner is a nucleation layer of CVD deposited tungsten. In one embodiment, the amorphous tungsten liner is processed with $B_2H_6+WF_6$ gases. In one embodiment, the amorphous tungsten liner is processed with $SiH_4+WF_6$ gases. FIG. 5C shows results after step 555, showing an amorphous tungsten liner 507 over the barrier layer 506. The amorphous tungsten liner 507 is represented by a dashed line to differentiate it from the barrier layer 506.

In step 560, a bulk layer of tungsten is formed by CVD deposition. Note that the tungsten is being deposited on a barrier metal such as a TiN film that may have small grains. A grain size of the CVD tungsten may be affected by the grain size of the underlayer. Therefore, if the amorphous layer of step 555 was not deposited, then the grain size of the CVD deposited tungsten could also be about 30 nm. However, in some embodiments, the amorphous layer of tungsten is not affected by the under layer. When depositing the bulk layer of tungsten using CVD in step 560, the grain size of the tungsten will not have a small gain size. Instead, the bulk deposited tungsten can have a large grain size. In one embodiment, the bulk layer of tungsten is processed with $H_2+WF_6$ gases. Together, steps 555 and 560 are one embodiment of step 420.

Figure 5D:
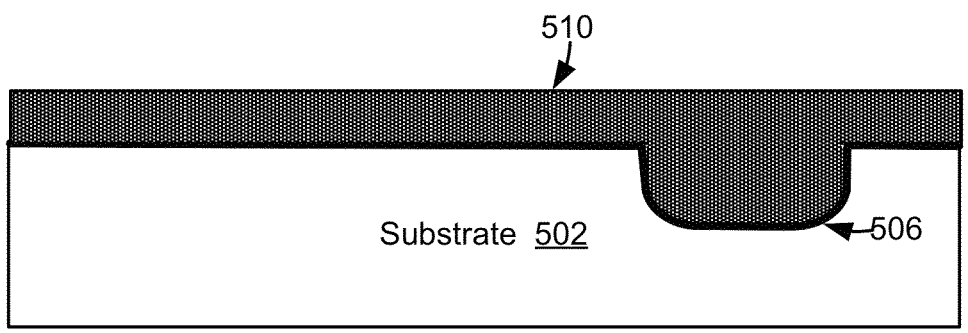

FIG. 5D shows results after step 560. FIG. 5D shows a first layer of tungsten 510, which has been formed in the feature 504. In this example, the first layer of tungsten 510 completely fills the feature 504. Stated another way, the first layer completely covers the feature 504. In other words, the first layer of tungsten 510 is not merely a liner in the feature 504. The first layer of tungsten 510 that is deposited using CVD is able to provide for good gap filling in the feature 504. The first layer 510 also extends over the substrate 502 outside of the feature 504. In one embodiment, the first layer 510 includes a nucleation layer and a bulk layer and is formed directly over (e.g., in contact with) the barrier layer 506. The amorphous layer 507 is not shown in FIG. 5D.

Figure 5E:
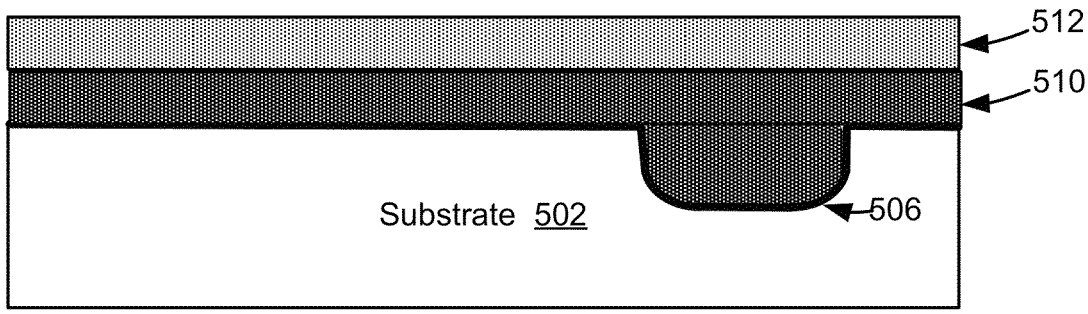

In step 565, a layer of tungsten is formed using PVD. Note that the grain size of PVD deposited tungsten may be affected by the grain size of its underlayer. Since, the bulk layer of tungsten can have a large grain size, the PVD deposited tungsten can also have a large grain size. The second layer may be deposited directly onto the first layer of tungsten. The second layer may be deposited without planarizing the first layer. Step 565 is one embodiment of step 430. FIG. 5E shows results after step 565. FIG. 5E shows the second layer of tungsten 512 over the first layer 510. In one embodiment, the second layer 512 is in direct contact with the first layer 510. Note that the PVD tungsten layer 520 may have a very smooth surface. Therefore, the second layer 520 does not need to be planarized to achieve a smooth surface.

Figure 5F:
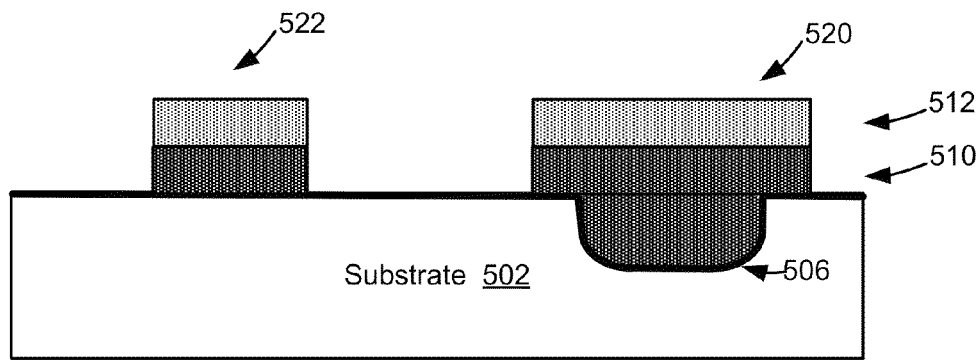

In step 570, patterning and etching is performed to form metal lines or wires. Step 570 may include depositing material for a mask and patterning the mask. Then, the first and second layers of tungsten 510, 512 may be etched based on the pattern for form, for example, metal lines. FIG. 5F shows results after step 570. FIG. 5F shows that a first metal line 520 has been formed above the feature, and a second metal line 522 has been formed in a region of the substrate 502 away from the feature 522.

Figure 6A:
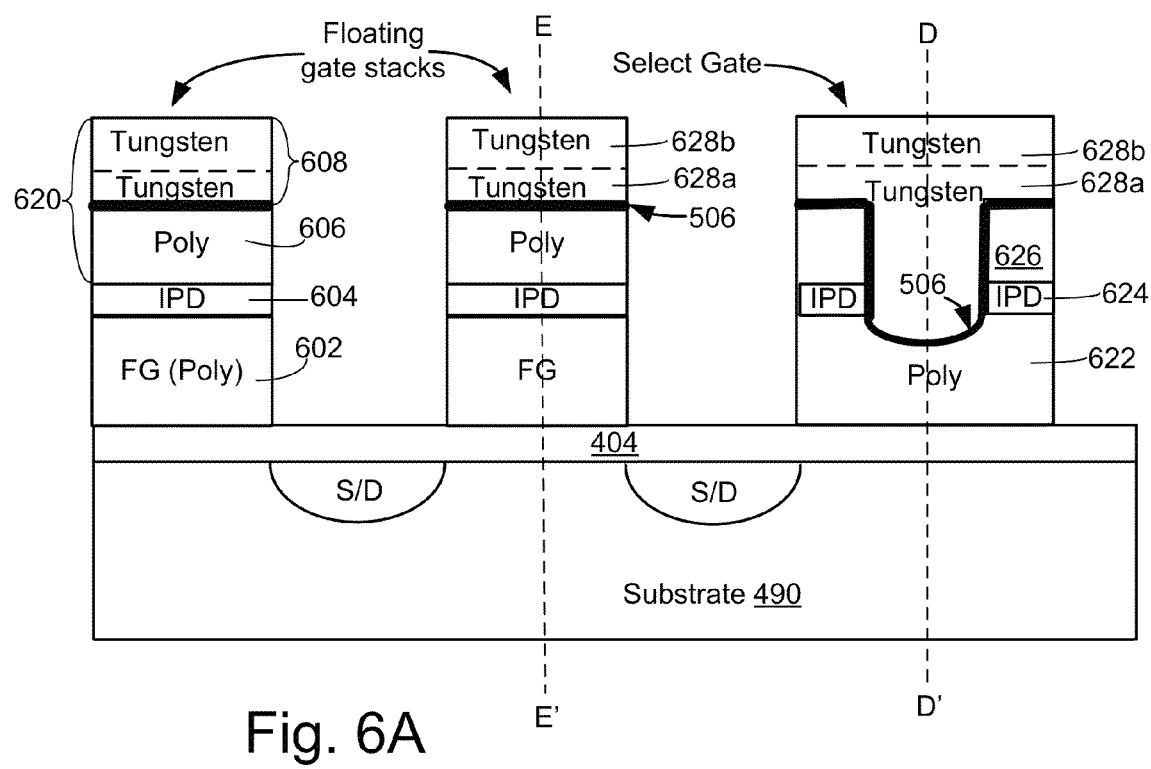
FIG. 6A shows one end of a NAND string with two memory cells and one select gate.
Figure 6B:
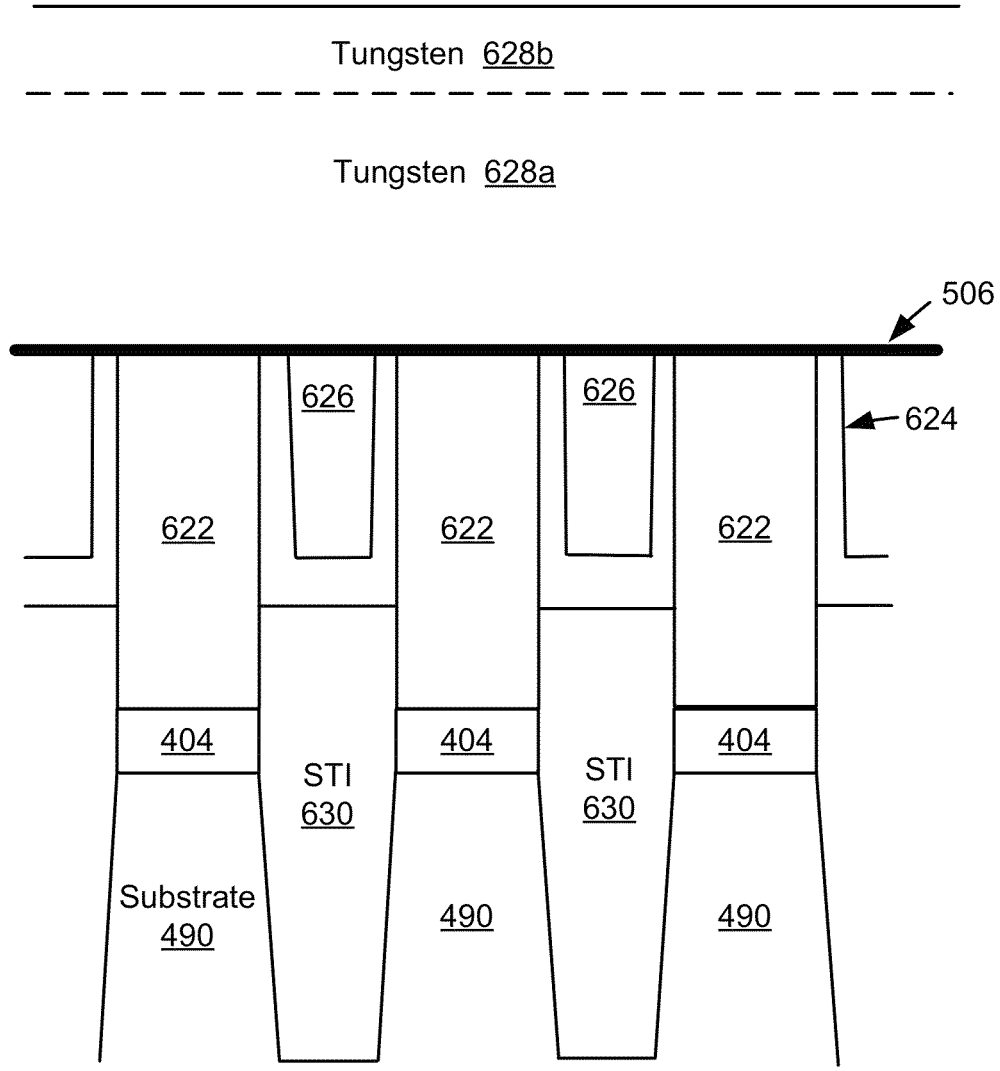
FIG. 6B shows three select gates separated by shallow trench isolation (STI) structures.
Figure 6C:
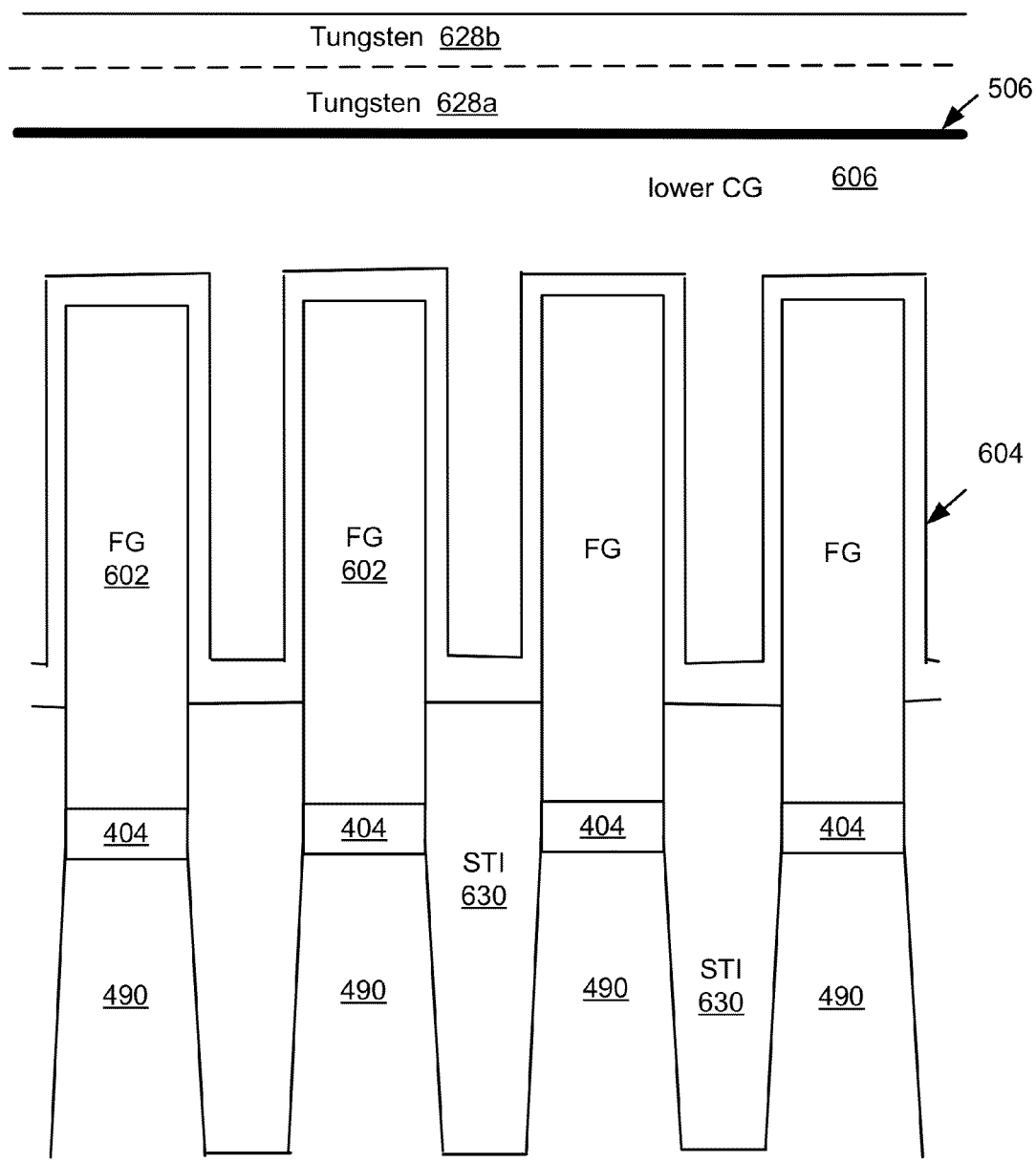
FIG. 6C shows four memory cells separated by shallow trench isolation (STI) structures.

In one embodiment, a hybrid CVD/PVD process is used to form metal lines in a memory array. FIG. 6A shows memory cells and a select transistor that are formed in one embodiment that uses a hybrid CVD/PVD process. FIG. 6A is along the perspective from line A-A' from FIG. 2B. FIG. 6B shows a perspective along line D-D' from FIG. 6A, and shows several select transistors and a select line. Note that this is along line C-C' from FIG. 2B. FIG. 6C shows several memory cells and a word line for line E-E' from FIG. 6A. Note that this is along a perspective along line B-B' from FIG. 2B. In one embodiment, the tungsten regions in FIGS. 6A-6C are formed using a hybrid CVD/PVD process.

Referring back to FIG. 3, a NAND string with memory cells and select gates at either end is depicted. FIG. 6A shows one end of a NAND string with two memory cells and one select gate. FIG. 6A shows two floating gate stacks for a respective two memory cells and a select gate transistor. A floating gate stack includes a floating gate (FG) 602, inter-poly dielectric (IPD) 604, and a control gate 620. In this example, the control gate 620 includes a lower portion 606 formed from polysilicon and an upper portion 608 formed from tungsten.

In this example, the select gate transistor and the floating gate stacks may be formed in the same process flow. Thus, some of the layers in the select gate may be formed from the same material used for form some of the layers in the floating gates. The lower portion of the select gate may be polysilicon 622, and may be formed from the same layer of polysilicon used to form the floating gates 602. Also, the IPD may be formed in the region where select gates are formed. However, since the select gate transistor should not have a floating gate, the IPD 624 has been etched at least partially away. In one embodiment, there is no IPD remaining in the select gate. The upper portion of the select gate has a polysilicon region 626, which may be formed from the same layer that region 606 of floating gate stacks is formed. However, at least some of polysilicon region 606 is etched away in one embodiment. This allows the tungsten region 628a to extend down to the lower polysilicon region 622. Note that there may be a barrier layer 506 between the tungsten 628a and lower polysilicon region 622. The tungsten in the select gate includes a lower tungsten region 628a, which may have been formed using CVD, and an upper tungsten region 628b, which may have been formed using PVD. Likewise, the floating gate stacks include a lower tungsten region 628a, which may have been formed using CVD, and an upper tungsten region 628b, which may have been formed using PVD.

Figure 7:
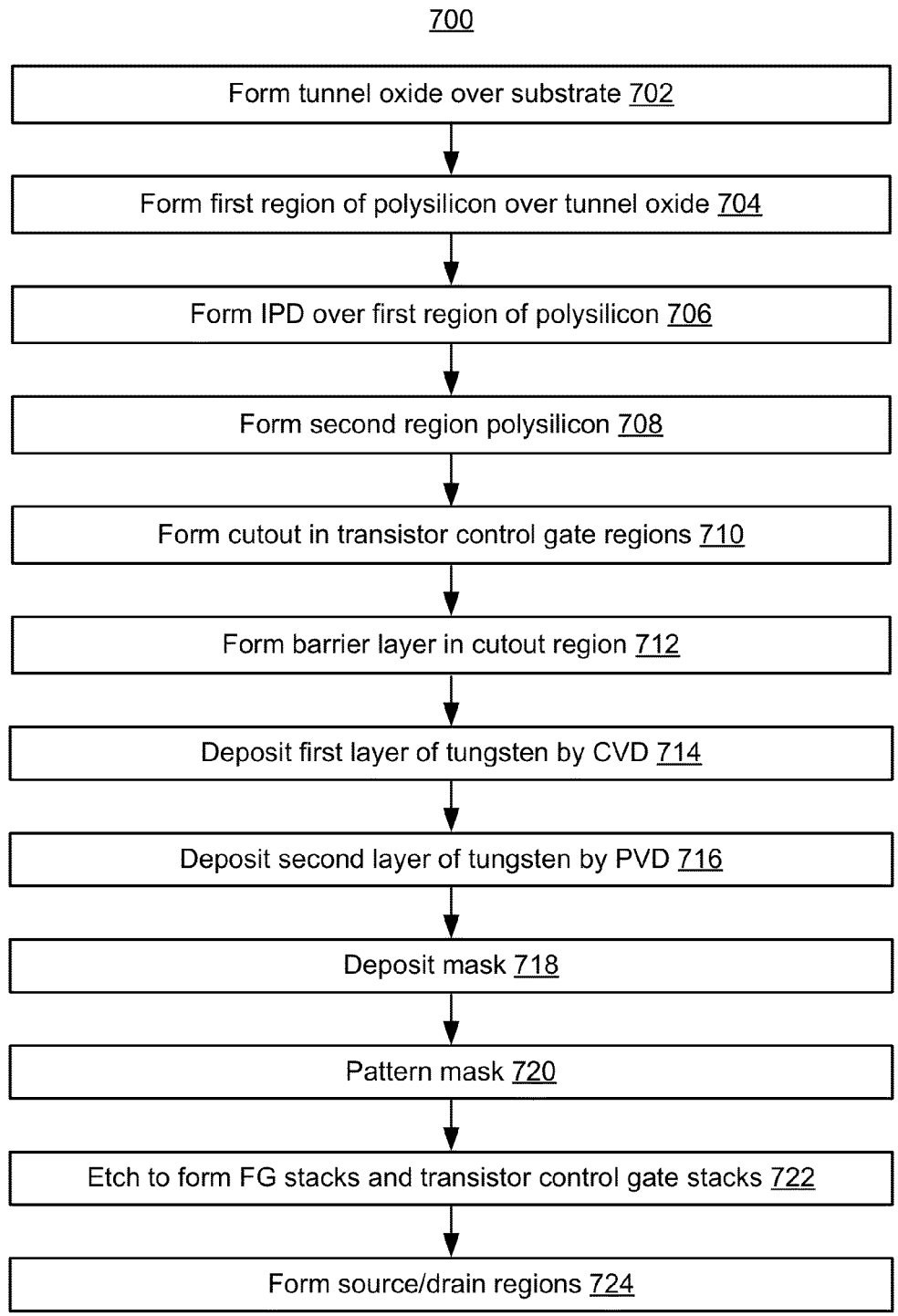
FIG. 7 is a flowchart of one embodiment of a process of forming a memory array having metal lines formed using a hybrid CVD/PVD process.

FIG. 7 is a flowchart of one embodiment of a process 700 of forming a memory array having metal lines formed using a hybrid CVD/PVD process. FIGS. 8A-8E are diagrams illustrating different stages of one embodiment of fabrication of a portion of a memory array. Specifically, FIGS. 8A-8E show formation of the structure of FIG. 6A. FIGS. 8A-8E depict a cross section along a potions of line A-A' in FIG. 2A. FIGS. 8A-8E will be referred to when discussing the process of FIG. 7.

This flowchart does not describe all implant steps, the gap fill of etched volumes between the floating gate stacks, or forming the contacts, metallizations, vias, and passivation, as well as other portions of the manufacturing process known in the art. For example, the formation of shallow trench isolation structures (STI) that may separate NAND strings are not discussed. There are many ways to manufacture memory according to embodiments and, thus, the inventors contemplate that various methods other than that described by FIG. 7 can be used. While a flash memory chip will include core memory and peripheral circuitry, the process steps of FIG. 7 are intended only to describe in general terms one possible process recipe for the fabrication of the floating gate stacks. For example, the floating gates can be formed to have many different shapes. In some embodiments, the floating gates have a relatively wide base with a relatively narrow stem above the base.

In step 702, a tunnel oxide is formed over a substrate. In step 704, a region of polysilicon is deposited for eventual formation of floating gates. This region of polysilicon may also be used for a lower portion 622 of gates of transistors, such as select gate and periphery transistors. The polysilicon may be deposited using CVD, PVD, ALD or another suitable method. In some embodiments, the polysilicon is doped in-situ. In some embodiments, the polysilicon is doped later. For example, one or more impurities are implanted after the polysilicon is deposited.

In step 706, an inter-poly dielectric (IPD) layer is formed. In some embodiments, the IPD is formed from multiple layers of materials. The IPD may be a dielectric. For example, the IPD may be what is commonly referred to as ONO, which includes alternating conformal layers of silicon dioxide ("O") and silicon nitride ("N"). In one embodiment, the IPD comprises nitride-oxide-nitride-oxide-nitride.

Figure 8A:
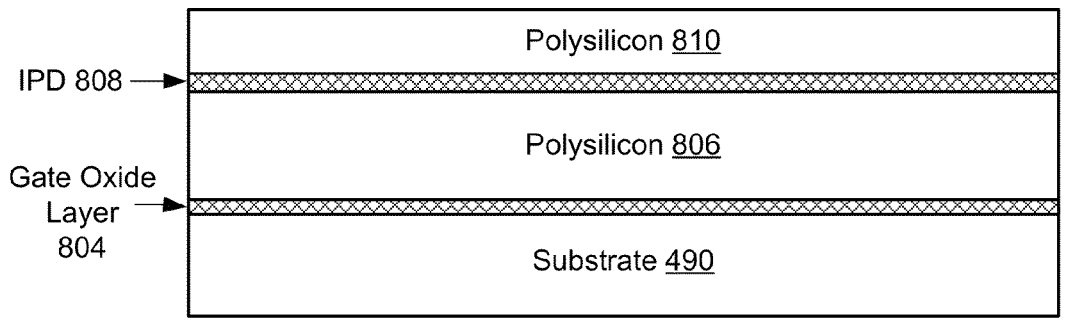
FIGS. 8A-8E are diagrams illustrating different stages of one embodiment of fabrication of a portion of a memory array.

In step 708, a first region of polysilicon is formed to be used for lower portions of control gates of memory cells. Some of this first region of polysilicon may also be present in the select gates. FIG. 8A shows results after step 708. In FIG. 8, a gate oxide layer 804 is formed over substrate 490. A first polysilicon layer 806 is formed over gate oxide layer 804. An IP 808 is formed over polysilicon layer 806. A second polysilicon layer 810 is formed over the IPD 808.

In step 710, a control gate/IPD cutout is made in regions in which select gates will be formed. The cutouts may also be formed in regions where gates of periphery transistors will be formed. A reason for these cutouts is to form select gates that do not have the IPD forming a barrier. In other words, whereas memory cells have a floating gate that is separated from the control gate by the IPD, select gates and other transistors should not have a floating gate. Therefore, a portion of the IPD is removed where select gates and other transistors will be formed.

Figure 8B:
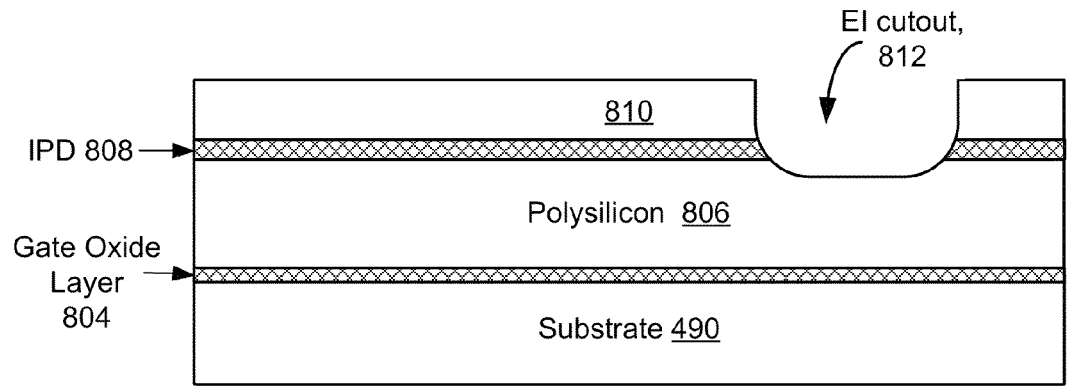

FIG. 8B shows results after step 710. FIG. 8B depicts the cutout region 812 in which a portion of the second polysilicon layer 810 has been removed, a portion of the IPD 808 has been removed, and a portion of the first polysilicon layer 806 has been removed. In some embodiments, etching is performed to create the cutout 812.

Figure 8C:
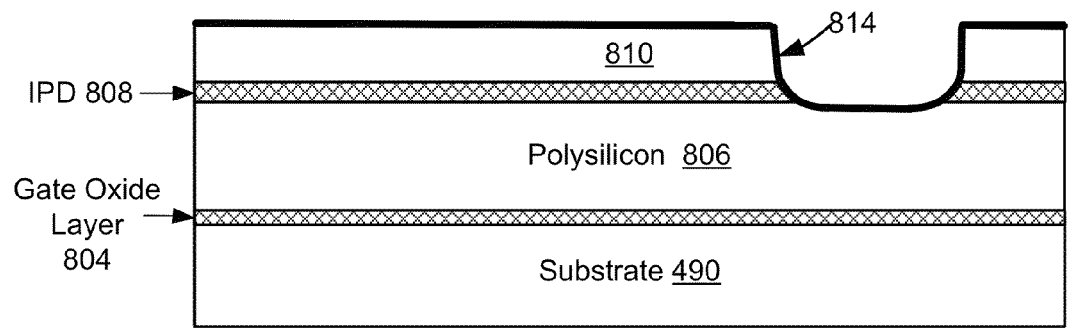

In step 712, a barrier layer is formed in the cutout region 812. The barrier layer may be, for example, TiN or WN. Thus, the barrier layer may be a barrier metal. FIG. 8C shows results after step 712. FIG. 8C shows barrier layer 814 formed in the cutout 812 and over the second polysilicon region 810 outside of the cutout 812. Step 710 is one embodiment of step 550 from FIG. 5A. Thus, the cutout 812 is one example of a feature.

Figure 8D:
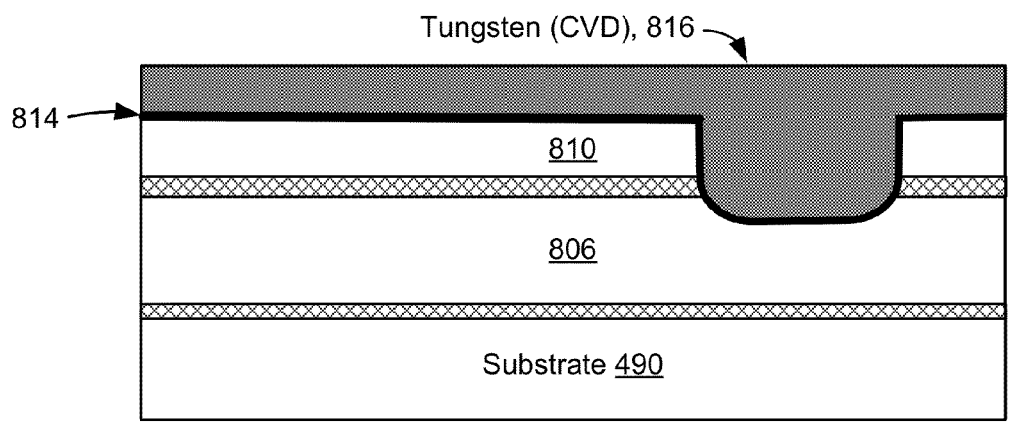

In step 714, a first layer of tungsten is deposited by CVD in the cutout 812. In one embodiment, the tungsten completely fills the cutout 812. FIG. 8D shows results after step 714. FIG. 8D shows a first layer of tungsten 816, which has been formed in the cutout. In this example, the first layer of tungsten 816 completely fills the cutout. In other words, the tungsten is not merely a liner in the cutout 812. The first layer 816 also extends over the barrier layer 814 and second layer of polysilicon 810 outside of the cutout 812. In one embodiment, the first layer of tungsten 816 is formed directly over (e.g., in contact with) the barrier layer 814. Step 714 is one embodiment of step 420 from FIG. 4. In one embodiment, step 714 includes forming an amorphous tungsten liner using CVD, and then forming a bulk region of tungsten using CVD. Thus, steps similar to steps 555 and 560 may be used in step 714.

Figure 8E:
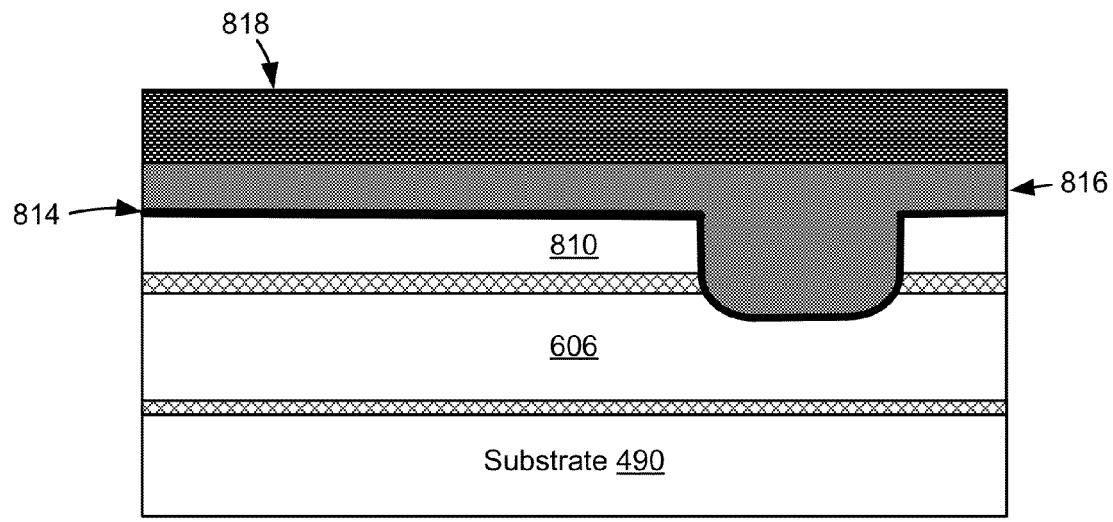

In step 716, a second layer of tungsten is deposited over the first layer of tungsten by PVD. The second layer may be deposited directly onto the first layer of tungsten. The second layer may be deposited without planarizing the first layer. FIG. 8E shows results after step 716. FIG. 8E shows the second layer of tungsten 818 over the first layer 816. In one embodiment, the second layer 818 is in direct contact with the first layer 816.

In step 718, a hardmask layer is formed over the second layer of tungsten 818. In step 720, a pattern is formed in the hard mask such that etching can later be performed to create floating gate stacks and select gates (and other transistors). In one embodiment, a SiN hard mask is patterned as follows. In previous steps, SiN is deposited over the entire polysilicon layer using, for example, CVD. Next, a photoresist layer is added over the SiN. The photoresist is exposed and developed to form a mask pattern. The pattern is transferred to the SiN, thus forming the SiN hard mask. In step 722, floating gate stacks and gates for select gate transistors (and other transistors) are formed by etching based on the SiN mask.

In step 724, doping may be performed to create source/drain regions for memory cells, as well as a source and/or drain regions for transistors (e.g., select gate transistor, periphery transistors). The hard mask may remain in place while doping to create the source/drain regions. Later the hard mask may be removed.

FIG. 6A depicts results after step 724. FIG. 6A shows two floating gate stacks for a respective two memory cells and a stack for a select gate transistor. A floating gate stack includes a floating gate 602, IPD 604, and a control gate 620. A select gate transistor stack includes lower polysilicon region 622 and tungsten region 628a, 628b. Note that there may be some IPD 624 remaining in the select gate transistor stack. There may be some polysilicon 626 remaining in the upper portion of the select gate transistor stack. Thus, in this example, both the floating gate stacks and select gate transistor stack have an upper portion that is formed by a hybrid CVD/PVD process. Note that the tungsten portion of the floating gate stacks may form at least a portion of a word line (e.g., word line 252, FIG. 2B). The tungsten portion of the floating gate stacks may form at least a portion of a select line (e.g., select line 251, FIG. 2B or SGS or SGD, FIG. 2A).

Figure 9A:
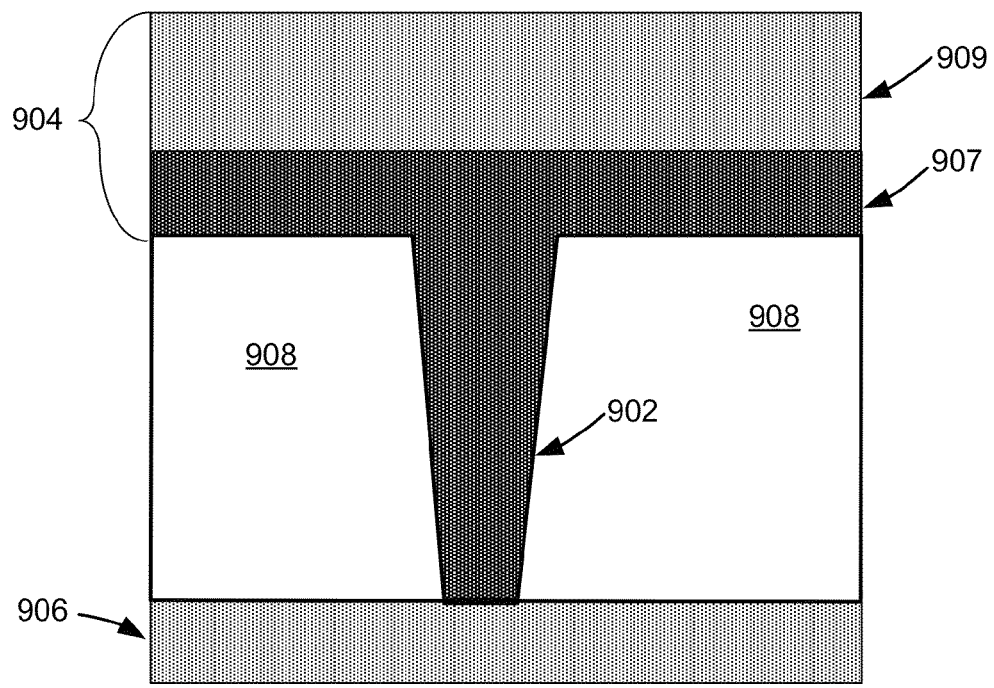
FIG. 9A shows an example structure that may be formed using a hybrid CVD/PVD process.

FIG. 9A shows another example structure that may be formed using a hybrid CVD/PVD process. This structure has a via 902 that connects a tungsten wire 904 to a conductive region 906 below the via 902. The lower portion 907 of the tungsten wire 904 may be formed using CVD. The upper portion 909 of the tungsten wire 904 may be formed using PVD. The conductive region 906 could be a metal layer, or any other conductor, such as highly doped polysilicon. In one embodiment, conductive region 906 is a lower metal line, and tungsten wire 904 is an upper metal line. The via 902 is one example of a feature that may be filled with tungsten in a hybrid CVD/PVD process. The via 902 is formed in a material 908 that may be an insulator, as one possibility.

Figure 9B:
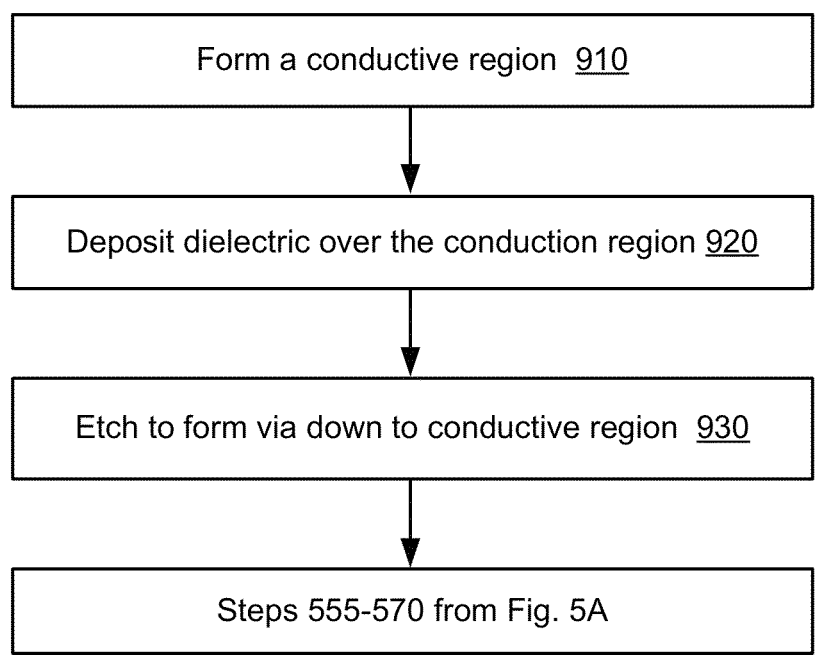
FIG. 9B is a flowchart of one embodiment of a hybrid CVD/PVD process for forming a structure such as the one of FIG. 9A.

FIG. 9B is a flowchart of one embodiment of a hybrid CVD/PVD process 900 for forming a structure such as the one of FIG. 9A. Reference will be made to the structure of FIG. 9A. In step 910, a conductive region 906 is formed. This could be a metal line, as one example. In step 920, a dielectric region 908 is formed over the conductive region 906. The dielectric region could be an insulator.

In step 930, patterning and etching is performed to form a via 902 in the dielectric region 908 down to the conductive region 906. Next, steps 555-570 from FIG. 5A may be performed to fill the via with tungsten using CVD (e.g., steps 555, 560), deposit a layer of tungsten using PVD (e.g., step 565), and pattern and etch the layers of tungsten to form the wire (e.g., step 570). The result is depicted in FIG. 9A. Optionally, step 550 may be performed to form a thin barrier layer (e.g., barrier metal) prior to depositing the tungsten using CVD.

Figure 10B:
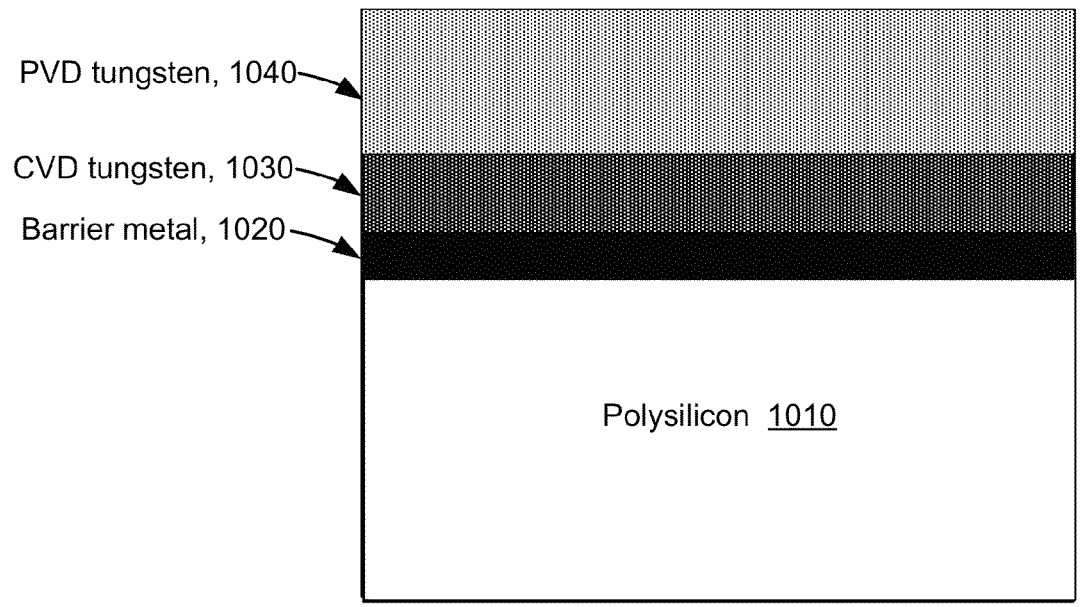
FIG. 10B shows a structure pertaining to the chart of FIG. 10A.
Figure 10A:
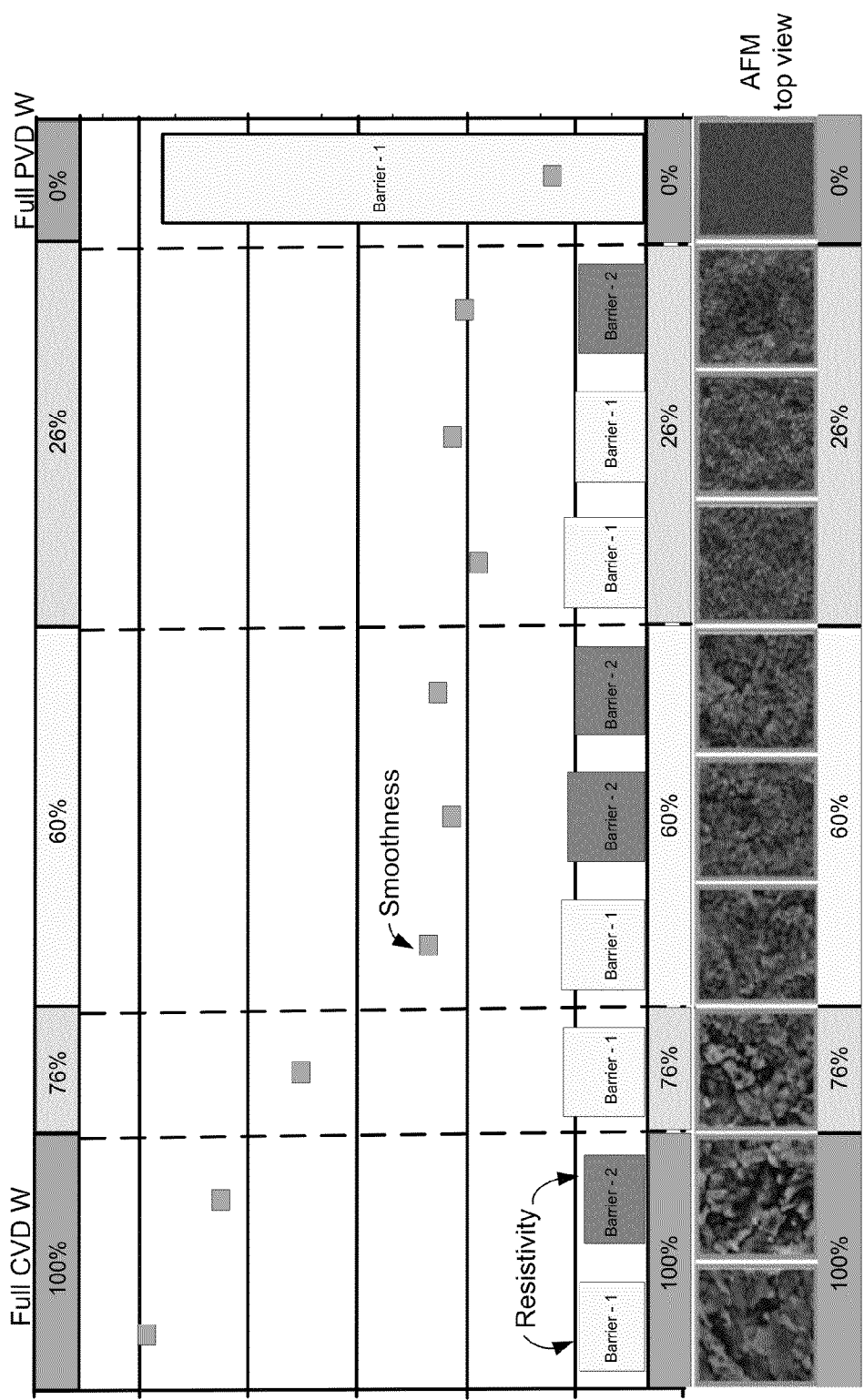
FIG. 10A is a chart that illustrates how resistivity and surface roughness may vary as the relative percentages of CVD tungsten to PVD tungsten change.

FIG. 10A is a chart that illustrates how resistivity and surface roughness may vary as the relative percentages of CVD tungsten to PVD tungsten change. The chart is for a structure as depicted in FIG. 10B. The structure includes layers of polysilicon 1010, barrier metal 1020, CVD tungsten 1030, and PVD tungsten 1040. The percent CVD thickness is given by (CVD thickness)/(CVD thickness+PVD thickness). The chart shows values ranging from 100% CVD thickness to 0% CVD thickness. Two different barrier materials are shown. Barrier 1 is TiN and Barrier 2 is WN.

The resistivity is shown by the height of the bars labeled "barrier 1" or "barrier 2". The resistivity is generally low providing that there is at least some CVD tungsten. However, when all of the tungsten is PVD, then the resistivity is quite high. This shows that having at least some CVD tungsten may provide for low resistivity between the tungsten and barrier metal.

The roughness of the surface and is shown by the boxes above the bars labeled as barrier 1" or "barrier 2". As is evident, the surface roughness is lower when more PVD tungsten is used. The AFM top view shows diagrams to illustrate the roughness/smoothness of the surface. As can be seen, the surface is smoother when the structure favors a greater percentage of PVD thickness.

In one embodiment, the percentage of CVD to PVD tungsten that is used is selected based on factors such as desired properties (e.g., resistivity with barrier metal, smoothness, gap filling) and the type of structure being formed (e.g., underlying via or trench, no via or trench, etc.).

One embodiment includes a method comprising forming a first layer of tungsten by chemical vapor deposition (CVD) in a feature to completely fill the feature, and forming a second layer of tungsten directly over the first layer of tungsten by physical vapor deposition (PVD). The method may further include forming a barrier layer (e.g., barrier metal) within the feature prior to depositing the first layer of tungsten. The method may further include etching the first layer of tungsten and the second layer of tungsten to form a metal line.

One embodiment includes method of forming a select line in a memory array. A region of polysilicon in which select gates of the memory array are to be formed to form a feature in the polysilicon is etched. A first layer of tungsten is formed by chemical vapor deposition (CVD) over the polysilicon outside of the feature and within the feature to completely fill the feature. A second layer of tungsten is formed directly over the first layer of tungsten by physical vapor deposition (PVD). The first layer of tungsten and the second layer of tungsten are etched to form the select line in the memory array.

One embodiment includes a method of forming a metal line. The method comprises forming a feature in a material (such as a substrate), and forming barrier metal within the feature and over the material outside of the feature. The method further comprises depositing a first layer of tungsten by chemical vapor deposition (CVD) over the barrier metal in the feature and over the barrier metal outside of the feature such that the first layer of tungsten completely covers the feature. The method further comprises depositing a second layer of tungsten directly over the first layer of tungsten by physical vapor deposition (PVD). The method further comprises etching the first layer of tungsten and the second layer of tungsten to form the metal line.

Numerous examples have been provided herein in which a hybrid CVD/PVD process is used to deposit tungsten using CVD and tungsten using PVD. However, other metals may be deposited in a hybrid CVD/PVD process.

The foregoing detailed description of embodiments has been presented for purposes of illustration and description. It is not intended to be exhaustive or to limit embodiments to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method of fabricating metal lines in a semiconductor device, the method comprising:
   forming a first layer of tungsten by chemical vapor deposition (CVD) in a feature to fill the feature; and
   forming a second layer of tungsten directly over the first layer of tungsten by physical vapor deposition (PVD).

2. The method of claim 1, wherein the forming a first layer of tungsten by chemical vapor deposition (CVD) further includes:
   depositing the first layer of tungsten over a region outside of the feature.

3. The method of claim 2, further comprising etching the first layer of tungsten and the second layer of tungsten to form a metal line.

4. The method of claim 1, further comprising:
   forming a barrier layer within the feature prior to depositing the first layer of tungsten.

5. The method of claim 4, wherein the forming a first layer of tungsten by chemical vapor deposition (CVD) includes:
   forming an amorphous layer of tungsten directly over the barrier layer using CVD; and
   forming a bulk region of tungsten using CVD over the amorphous layer of tungsten.

6. The method of claim 4, wherein the barrier layer includes titanium nitride (TiN).

7. The method of claim 4, wherein the barrier layer includes tungsten nitride (WN).

8. The method of claim 1, wherein the forming a second layer of tungsten is performed without planarizing the first layer of tungsten.

9. A method of forming a select line in a memory array, the method comprising:
   etching a region of polysilicon in which select gates of the memory array are to be formed to form a feature in the polysilicon;
   forming a first layer of tungsten by chemical vapor deposition (CVD) over the polysilicon outside of the feature and within the feature to completely fill the feature;
   forming a second layer of tungsten directly over the first layer of tungsten by physical vapor deposition (PVD); and
   etching the first layer of tungsten and the second layer of tungsten to form the select line in the memory array.

10. The method of claim 9, further comprising:
    forming a barrier layer over the polysilicon and within the feature prior to forming the first layer of tungsten.

11. The method of claim 10, wherein the barrier layer includes TiN.

12. The method of claim 10, wherein the barrier layer includes WN.

13. The method of claim 10, wherein the forming a first layer of tungsten by chemical vapor deposition (CVD) includes:
    forming an amorphous layer of tungsten directly over the barrier layer using CVD; and
    forming a bulk region of tungsten using CVD over the amorphous layer of tungsten.

14. A method of forming a metal line, the method comprising:
    forming a feature in a material;
    forming a barrier metal within the feature and over the material outside of the feature;
    depositing a first layer of tungsten by chemical vapor deposition (CVD) over the barrier metal in the feature and over the barrier metal outside of the feature such that the first layer of tungsten completely covers the feature;
    depositing a second layer of tungsten directly over the first layer of tungsten by physical vapor deposition (PVD); and
    etching the first layer of tungsten and the second layer of tungsten to form the metal line.

15. The method of claim 14, wherein the forming a feature includes forming a via.

16. The method of claim 15, wherein the metal line is an upper metal line, and further comprising forming a lower metal line below the via, the tungsten in the via electrically connects the upper metal line to the lower metal line.

17. The method of claim 15, wherein the forming a feature includes:
- forming a layer of polysilicon;
- forming a dielectric layer over the layer of polysilicon; and
- etching through the dielectric layer into the layer of polysilicon to form the feature, the feature is formed in a region where gates of select transistors of a memory array are formed, the metal line is a select line to the select transistors.

18. The method of claim 17, further comprising etching the first layer of tungsten and the second layer of tungsten to form word lines.

19. The method of claim 14, wherein the forming a barrier metal includes depositing a layer of TiN.

20. The method of claim 14, wherein the forming a barrier metal includes depositing a layer of WN.

21. The method of claim 14, wherein the forming a first layer of tungsten by chemical vapor deposition (CVD) includes:
- forming an amorphous layer of tungsten directly over the barrier metal using CVD; and
- forming a bulk region of tungsten using CVD over the amorphous layer of tungsten.

* * * * *